Figure 1:
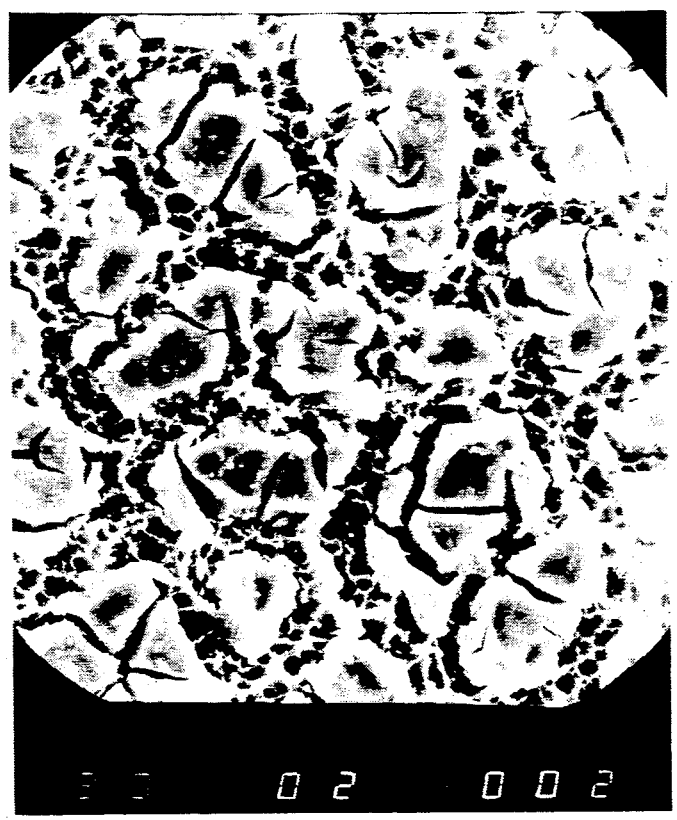

United States Patent [19]
Whitlaw et al.

[11] Patent Number: 5,106,473
[45] Date of Patent: Apr. 21, 1992

[54] PROCESS FOR METALLIZING A THROUGH-HOLE BOARD

[75] Inventors: Keith J. Whitlaw, Derbyshire; Mark Goodenough, Stockport, both of Great Britain

[73] Assignee: LeaRonal, Inc., Freeport, N.Y.

[21] Appl. No.: 695,473

[22] Filed: May 3, 1991

[30] Foreign Application Priority Data

May 9, 1990 [GB] United Kingdom ................ 9010328

[51] Int. Cl.$^5$ ............................................... C25D 5/02
[52] U.S. Cl. ................................... 205/150; 205/164; 205/196; 205/205
[58] Field of Search ............................. 204/15, 20, 30

[56] References Cited

U.S. PATENT DOCUMENTS 4,619,741 10/1986 Minten et al. .......................... 204/15
4,810,333 3/1989 Gulla et al. ............................ 204/15

FOREIGN PATENT DOCUMENTS

WO89/10431 12/1988 European Pat. Off. .
WO89/08375 12/1988 Fed. Rep. of Germany .

Primary Examiner—T. M. Tufariello
Attorney, Agent, or Firm—Pennie & Edmonds

[57] ABSTRACT

A process is provided for metallizing the hole-wall surface of a through-hole provided in a printed circuit board precursor. In an initial step, the hole-wall surface is pre-treated with an oxidizing agent which micro-roughens it. An electro-conductive polymer film is then formed on the micro-roughened surface by oxidatively polymerizing in situ an acidic solution of an organic monomer with an oxidizing agent previously adsorbed on the board. The polymer film includes dopant anions which are acquired from the monomer solution. Finally, a metal layer is electroplated on the electro-conductive polymer film.

16 Claims, 9 Drawing Sheets

PROCESS FOR METALLIZING A THROUGH-HOLE BOARD

The present invention is concerned with a process for metallising the hole-wall surface of a through-hole single-layer or multi-layer board. The metallised board acts as a precursor of a printed circuit board.

The metallisation of the hole-wall surface of a through-hole board is conventionally carried out by initially activating the hole-wall surface with copper or a mixture of palladium and tin. The activated surface is then coated with a thin film of copper by electroless deposition. This layer is subsequently reinforced by electrolytic deposition of a relatively thick layer of copper. It is essential for the electrolytic deposition that the previously deposited thin film of copper is conductive. If the step of forming the thin film is omitted, or if the thin film is formed from a non-conductive material then the electrolytic deposition cannot take place.

In spite of the wide spread acceptance of this technology, it has a number of disadvantages which have so far had to be tolerated in the absence of a commercially workable alternative. For instance, the electroless deposition step is relatively expensive to carry out and requires careful analysis and precise control of the electrolytes used. These electrolytes include relatively expensive chemicals which have only a low stability. Formaldehyde is usually also present in the electrolyte solution which is industrially disadvantageous.

A number of proposals have recently been made for a metallisation process which eliminates both the activation and electroless copper stages and replaces them by a single process step. For instance, U.S. Pat. No. 4,810,333 proposes forming a conductive copper sulphide layer on the hole-wall surface which can then be directly electroplated by displacement of manganese previously adsorbed on the surface during conventional pre-treatment of the board. U.S. Pat. No. 4,619,741 proposes the elimination of the activation and electroless deposition steps by a black hole technique using carbon black. However, neither of these proposals has proved to be industrially applicable, and so a simplified and reliable metallisation process for a printed circuit board precursor is still sought.

WO 89/10431 proposes a process for conditioning the surface of a through-hole formed in a printed circuit board to prepare the surface for subsequent metallization. The process comprises contacting the through-hole surface with a substantially water-immiscible organic liquid followed by an aqueous alkaline solution comprising permanganate ions. The organic liquid serves to enhance the effectiveness of the subsequent permanganate treatment.

Also recently in WO 89/08375, a process has been proposed for metallizing the hole-wall surface of a through-hole board in which the surface to be metallized is pre-treated in an oxidising solution. The pre-treated board is then placed in a solution of a monomer such as pyrrole. The substrate is then removed from the monomer solution and transferred into an acidic solution in which the pyrrole previously coated on the board polymerises to form an electrically conductive polymer layer. Subsequently, galvanic or electroless metallization is carried out.

The object of the present invention is to provide a metallisation process for metallising the hole-wall surface of a through-hole board which overcomes the disadvantages of the known metallisation processes.

The present invention provides a process for metallising a through-hole board comprising the steps of:
pre-treating the board with an oxidising agent to micro-roughen its surface,
forming an electro-conductive polymer film on the micro-roughened surface by oxidatively polymerizing in situ an acidic solution of an organic monomer with an oxidising agent previously adsorbed on the board, the film incorporating dopant anions acquired from the monomer solution, and
electroplating a metal on the electroconductive polymer film.

Such a process provides a number of advantages over conventional metallisation processes which make use of activation and electroless deposition steps. For instance, the process is relatively easy to control and results in a substantial reduction in processing costs by e.g. halving the overall metallisation time. It also reduces the number of processing steps over some of the conventional processes thereby providing significant economic savings.

It is preferred that the metallisation process according to the present invention is applied to a single-layer, multi-layer, or high aspect ratio board which acts as a precursor of a printed circuit board. The circuit board may be based on either a polymeric substrate material such as glass fiber-reinforced epoxy or polyimide, or on a ceramic material. The board may be optionally provided on at least one of its side surfaces with an electro-conductive metal layer. The board itself may be a double sided 4:1 aspect ratio board, a multi-layer 4:1 aspect ratio board or a high aspect ratio 8:1 board. Once metallised, the laminate is subjected to further conventional processing steps to form a printed circuit board.

The pre-treatment step may include softening the board's surface with a conditioner prior to the oxidising step. This conditioning causes the non-conductive hole-wall surface to become activated and conditioned, and may be carried out by means of an organic solvent, preferably a nitrogen-containing solvent, or with an aqueous alkaline solution of such a solvent. It has been found that particularly good results can be obtained if the duration of the pre-treatment and oxidising steps are carefully controlled. For instance, the conditioning step may be carried out for around 3 minutes and the oxidation step may carried out for around 4 minutes.

It is particularly preferred that an oxidising agent should be used in the oxidising step which is adsorbed on the board's surface. Such an oxidising agent is for example the permanganate, manganate, periodate or dichromate of an alkali metal. Potassium permanganate is especially preferred. In the oxidation step, the surface of the hole-wall is micro-roughened which results in a stronger bond being formed between it and the later deposited metallised layer. The oxidising solution may include ionic or non-ionic surfactants in an amount of from 0.1 to 10 g/l which improves the quality of the oxidative pre-treatment.

It is preferred that the board is neutralised after the pre-treatment step and then re-oxidised by further application of an oxidising agent which may be the same or different from that used in the initial step. The oxidising agent used for re-oxidation may be selected from the alkali metal salts listed above. These neutralising and re-oxidising steps provide the advantage of improving the bonding between the later formed metallised layer and the hole-wall surface.

After these various pre-treatment steps, an aqueous acidic solution of an organic monomer is applied to the board. This results in the oxidative polymerisation of the monomer to form a polymer film in situ on the micro-roughened hole-wall surface. This film is rendered conductive by the incorporation of dopant anions acquired from the monomer solution. These anions may be derived from the acidic component present in the monomer solution and/or from a salt, e.g. of the acidic component, added to the monomer solution.

The presence of an acidic component in the monomer solution is essential for the polymerisation of the monomer to occur. In particular, polymerisation of the organic monomer does not occur in a solution having a neutral pH. Preferred acidic components are toluene sulphonic acid, methane sulphonic acid, hydrochloric acid or sulphuric acid. Toluene-4-sulphonic acid is particularly preferred, and the solution preferably also includes a salt, e.g. a tosylate salt such as sodium tosylate. In this case the dopant anions incorporated in the polymer film are tosylate ions. Particularly good results are obtainable if the toluene-4-sulphonic acid is contained in the monomer solution at a concentration of 1-50 g/l, and in particular about 5 g/l, and the sodium tosylate is contained at a concentration of 1-25 g/l, and in particular 7-15 g/l. The concentrations of the acid and salt components in the monomer solution should be adjusted so that the pH of the solution is in the range 1.7-2.5 to provide the best results.

The aqueous acidic solution of the organic monomer may include additional solvents or solubility promoters such as an alcohol e.g. methanol, ethanol, n-propanol, isopropanol, higher alcohols, polyalcohols, dimethyl formamide, ketones, cumene sulphonate, N-methyl pyrrolidone, triglyme or diglyme. It has been found that including up to 15% by volume, e.g. 10-15% by volume, of an alcohol such as methanol or propanol improves the stability of the solution. The organic monomer solution may further include gelatin which is found to improve the coverage of glass fibers which may be present in the laminate.

The conductivity of the polymer film is dependent upon the concentration of the organic monomer and acid present during its formation. It is also found that the conductivity is somewhat dependent upon the age of the organic monomer solution.

The film of organic polymer may be formed from most known organic conductive polymers such as polypyrrole, polyfurane, polyaniline or polythiophene or derivatives thereof. It has been found that polypyrrole or a derivative thereof provides particularly good results. In this case, the aqueous acidic solution of the monomer preferably contains 6-25 ml/l of pyrrole, and in particular about 15 ml/l of pyrrole.

Pyrrole solutions are reasonably stable in air, although they do suffer from photo-oxidative polymerisation to form an insoluble black precipitate often referred to as pyrrole black. Such a precipitate causes poor hole-wall adhesion and coverage due to adsorption of loose particulate materials on the surface and blockage of the holes after only one days use. This problem can be moderated by adding a wetting agent or surfactant to the pyrrole solution. This significantly reduces the rate of precipitation of pyrrole black by inhibiting the autocatalytic oxidation of pyrrole. This improves the stability of the monomer solution and enables it to be used for a much longer period. Preferably the surfactant is a non-ionic surfactant such as nonyl phenyl ethoxylate. The presence of such a surfactant has no detrimental effect on the polymerisation of the monomer and surprisingly appears to assist in the coverage of high aspect ratio boards.

The electro-conductive properries of a polypyrrole film are reasonably stable in air at room temperature. For instance, the conductivity of an unprotected film is unchanged after standing in air for six days and decreases by only about 20% after a year.

In the case that the board is subjected to a neutralising step during its pre-treatment, then it is essential that the pre-treatment should also include a later re-oxidation step in which an oxidising agent is adsorbed on the hole-wall surface of the board. In the absence of such adsorbed oxidising agent, polymerisation of the organic monomer does not occur.

After coating the hole-wall surface of the board with the film of electro-conductive organic polymer, the board is subjected to conventional electrolytic deposition of a metal such as nickel, gold, palladium, tin, lead or tin/lead, although copper is most preferred. The surface conductivity of the hole-wall surface necessary for electrolytic deposition is provided by the film of electro-conductive organic polymer.

The step of conventional electrolytic deposition may be preceded by a preliminary etching step using an acid peroxide oxidising solution such as Ronetch PS (obtainable from LeaRonal). This solution etches the inner layers and surface laminate to improve adhesion.

The polymer coated board acts as a precursor of a printed circuit board. The former may be converted into the latter by a number of different methods. In a first method, the polymer coated board is panel plated to a full thickness and then subjected to tent and etch. In a second method, the board is plated to a thickness of 5 microns, imaged and then successively pattern and tin plated. The resist is then stripped away and the stripped board finally etched. In a third method, the board is panel plated to a thickness of 15 microns, imaged and then pattern plated to a thickness of 15 microns. The pattern plated board is then tin plated, the resist stripped away and the resulting board finally etched. In a final method, the polymer coated board is imaged and then, successively pattern and tin plated. The resist is then stripped away, and the stripped board finally etched.

Figure 2:
Figure 3:
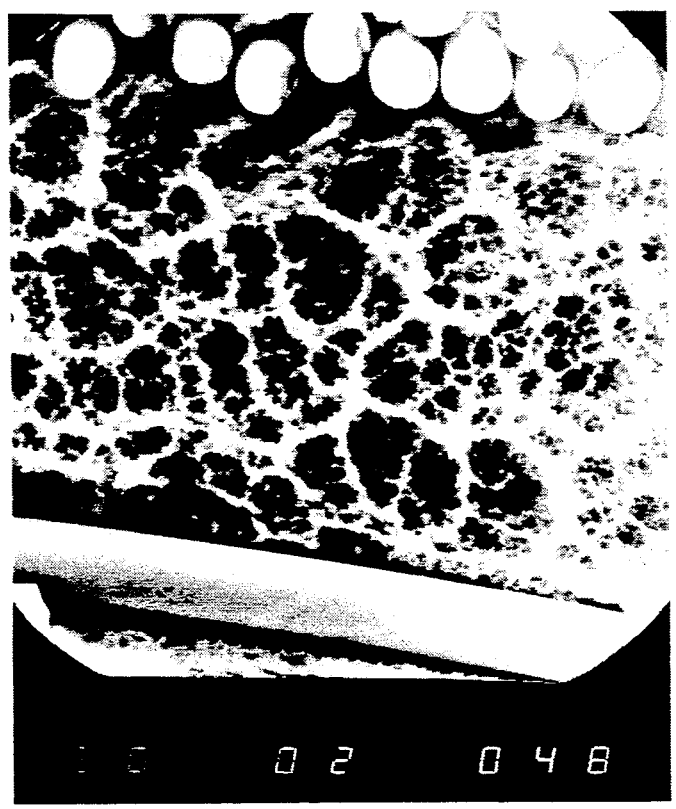
Figure 4:
Figure 5:
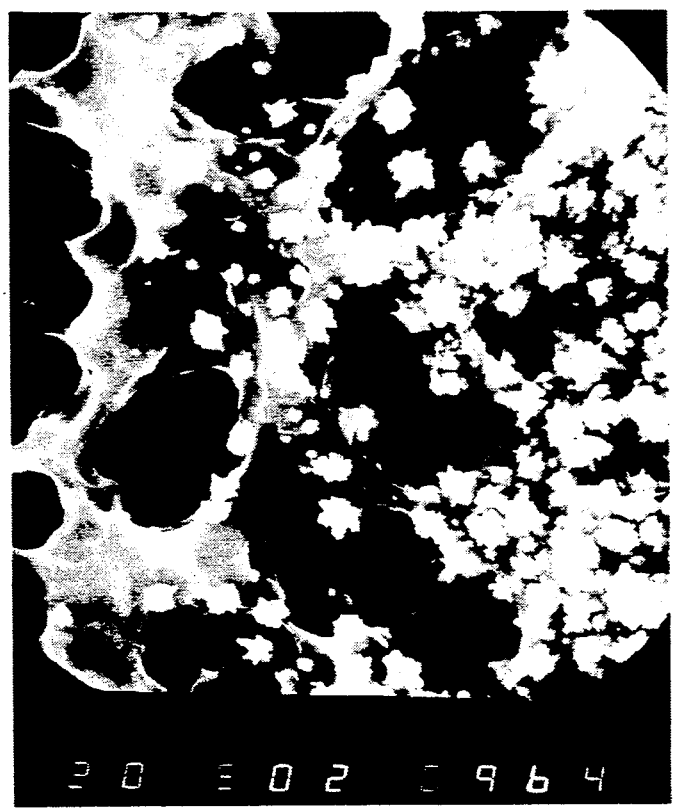
Figure 6:
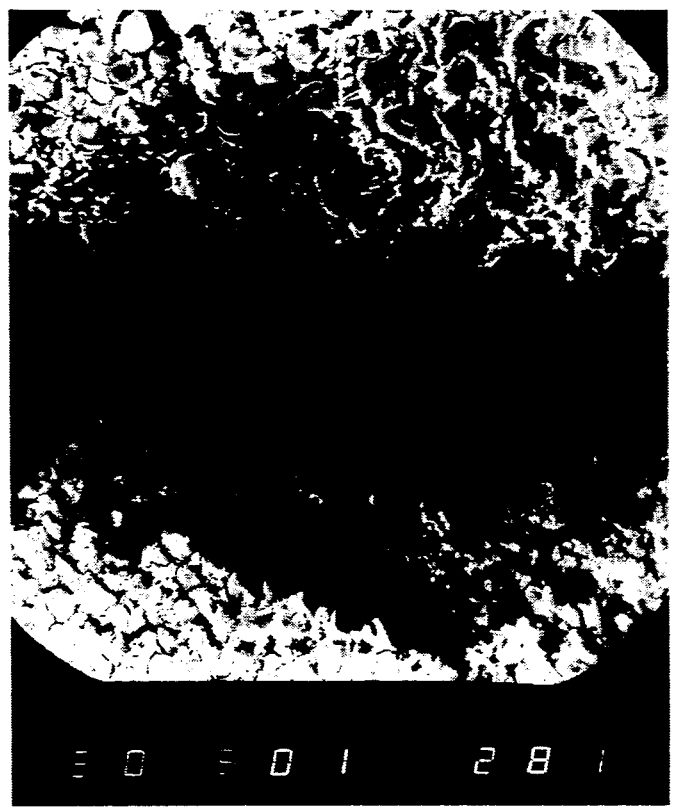
Figure 7:
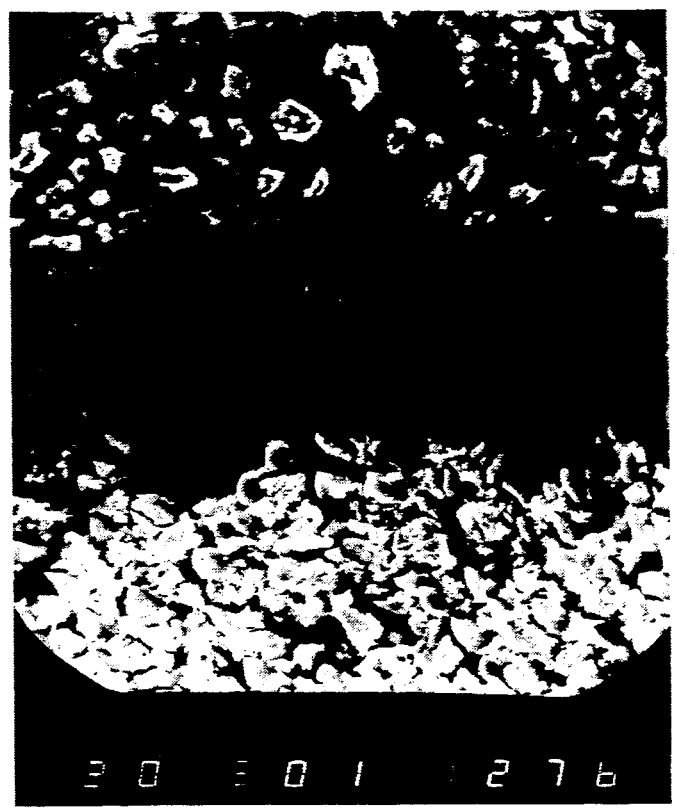
Figure 8:
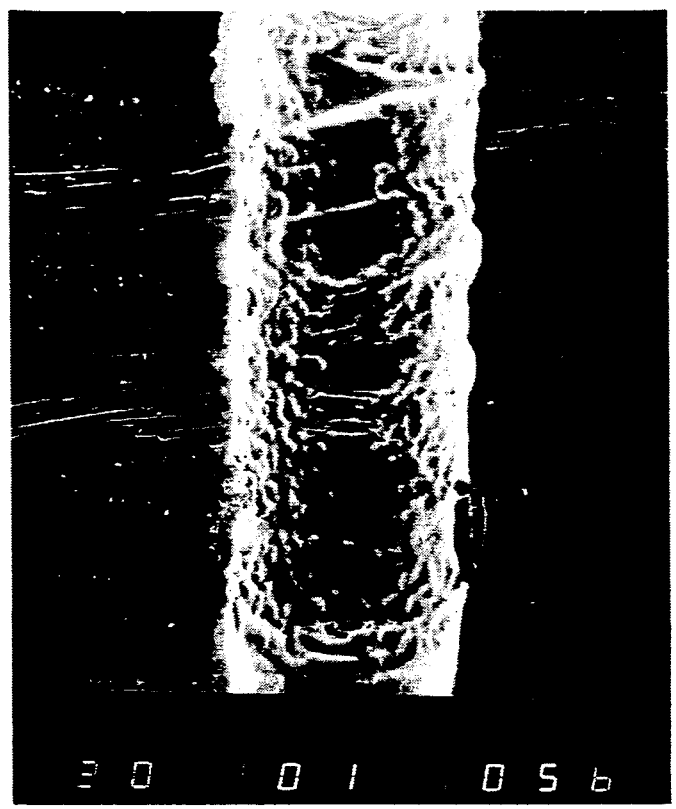
Figure 9:
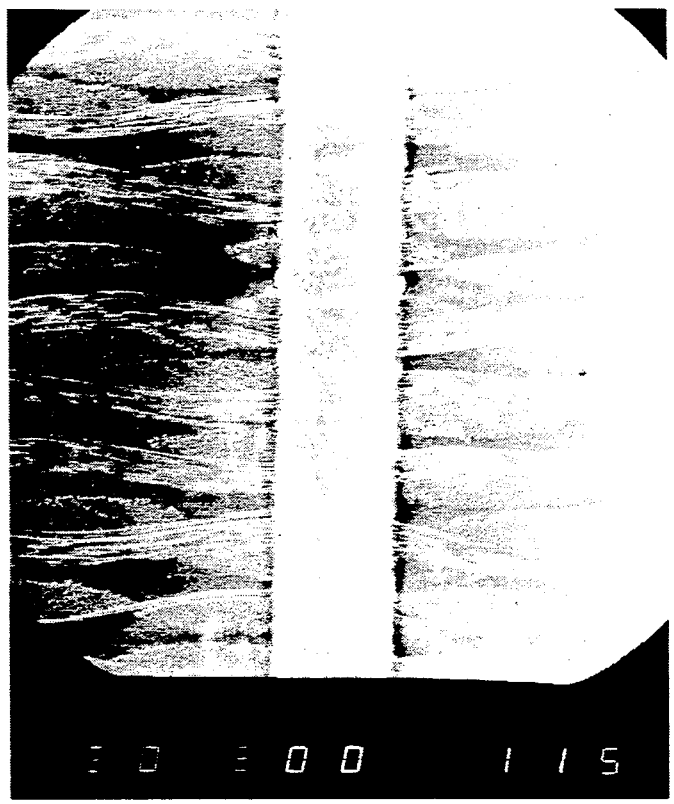

The present invention will now be further explained by way of the following examples in combination with the accompanying drawings in which:

FIG. 1 is an electron micrograph showing an epoxy laminate after pre-treatment including resin islands rich in manganese, FIG. 2 is an electron micrograph showing the binding action of copper to epoxy islands after treatment with pyrrole, FIG. 3 is an electron micrograph showing the effect of neutralisation on the topography of the drilled laminate, FIG. 4 is an electron micrograph showing the binding action of copper to epoxy prior to neutralisation and pyrrole coverage, FIG. 5 is an electron micrograph showing the nucleation spread of copper crystals across pyrrole coated epoxy, FIGS. 6 and 7 are electron micrographs showing the effect of permanganate age on the topography of the epoxy, and FIGS. 8 and 9 are electron micrographs showing hole-wall coverage of glass in high aspect ratio board plating.

Epoxy laminates were metallised by two process embodiments, A and B, in accordance with the present invention.

Turning firstly to method A, a drilled epoxy laminate is pre-treated separately with a conditioner and an oxidising agent. Reciprocal agitation is used during this and all subsequent stages of this process and also during all stages of process B described below. The conditioner is in the form of an aqueous alkaline organic solvent which has the function of softening the epoxy resin. The oxidising agent is a solution of potassium permanganate which micro-roughens the hole-wall surface of the epoxy laminate. This helps to ensure a strong bond between the hole-wall surface and the later deposited metallised layer. The conditioning is carried out for 3 minutes at a temperature of 65° C. The oxidation is carried out for a period of 15 minutes at 80° C. The epoxy laminate is rinsed for 2 minutes at 25° C. after both the conditioning and oxidation treatments.

FIG. 1 is an electron micrograph showing the appearance of the drilled epoxy laminate after the pre-treatment step of method A. The downhole topography of the laminate consists of a series of resin islands rich in manganese.

The pre-treated laminate is then treated with an aqueous acidic solution of an organic monomer such as pyrrole, furane, aniline or thiophene for a period of 1 minute at 25° C. The acidic component is preferably toluene-4-sulphonic acid, but this can be varied.

The organic monomer and acid components which are used are preferably Fluka reagent grade or laboratory grade BDH reagents. The monomer solution may comprise 1-50 g/l of toluene-4-sulphonic acid, 1-25 g/l of sodium toluene-4-sulphonate and 6-25 ml/l of pyrrole, preferably about 10 g/l, 10 g/l and 15 ml/l respectively. The pH of the resulting solution should be about 2.

The organic monomer in the solution polymerises in the presence of the acid and the oxidising agent adsorbed on the laminate surface to form a film of a conductive organic polymer on the hole-wall surface. The film coated laminate board is then dried at room temperature for 1 minute, after which it is subjected to conventional electroplating using e.g. an acid copper bath containing $CuSO_4.5H_2O$ (75 g/l), $H_2SO_4$ (120 ml/l), Copper Gleam 2000 Additive (obtainable from LeaRonal) and a carrier. The electroplating time is dependent upon the aspect ratio of the board. For an 8:1 board electroplating is carried out for 15 minutes at 1 $Adm^{-2}$ and then 60 minutes at 3 $Adm^{-2}$.

FIG. 2 is an electron micrograph showing the binding action of copper around the epoxy islands after treatment with pyrrole using method A.

In the second method, method B, a through-hole epoxy laminate board is again subjected to pre-treatment using a conditioner and an oxidiser. However, the conditioning treatment is carried out for 4 minutes at 65° C. and the oxidising treatment is carried out for 10 minutes at 80° C. The epoxy laminate is subjected to rinsing for 2 minutes at 25° C. after each of these steps.

The laminate is then subjected to neutralisation at 55° C. for 5 minutes followed by rinsing at 25° C. for 2 minutes. The neutralisation can be carried out for example in an aqueous solution of hydrazine hydrate including EDTA having a pH adjusted to about 7. During the neutralisation step, manganese rich resin islands present after the oxidation step are removed and the resin is left with a micro-rough honeycomb appearance as illustrated in FIG. 3. At this stage, the resin has a white appearance and is devoid of manganese. Such a micro-rough topography promotes good bonding between the hole-wall and metallised layer deposited later.

The laminate is then subjected to re-oxidation at 80° C. for 5 minutes using permanganate solution during which permanganate is adsorbed on the hole-wall surface of the laminate. The laminate is then subjected to further rinsing at 25° C. for 2 minutes. The remaining steps of applying the polymer and electroplating the metal are identical to those set out for method A except that the monomer solution is applied to the re-oxidised laminate for three minutes rather than one minute, and the electroplating is carried out in the case of an 8:1 ratio board for 30 minutes at 1 $Adm^{-2}$ and then for 110 minutes at 3 $Adm^{-2}$.

The surface to hole ratio obtained using the conducting polymer system of method B shows an improvement in distribution when compared to the conventional electroless copper metallisation process.

The topography of the micro-rough resin is unaffected by the re-oxidation treatment as illustrated in FIG. 4. This was shown by eliminating the conditioning stage from method B, the topography of the resin being scolloped shaped and smooth but high in manganese prior to neutralisation.

In the following examples, plating tests were carried out using FR4 drilled epoxy laminate obtained from Microtech which have a surface area of 0.5 $dm^2$. Thermal shock tests were carried out at 266° C. in solder or glycerol for 0.8 mm and 0.3 mm holes respectively. Hole-wall adhesion was graded using a conventional system, and hole-wall coverage was assessed by scanning electron microscopy.

Circuit board test pieces were metallised in accordance with process A. The polymer film was formed by using an aqueous solution comprising pyrrole (0.1 M) and toluene-4-sulphonic acid (0.1M). This solution also included nonyl phenyl ethoxylate as a surfactant which reduces the rate of formation of pyrrole black. Such a solution may be continuously used without deterioration in coverage or adhesion.

A polymeric film of polypyrrole having a thickness of 0.1 microns was formed as a black adherent coating on the hole-wall surface of the laminate. Because this black film is conductive, it may be electroplated with an adherent metal layer e.g. copper by electrolytic deposition. The copper is not instantaneously deposited across the entire surface of the conductive polymer film, but rather spreads across the surface apparently by a mechanism of nucleation spread of the copper nuclei across the film. The density of nucleation sites increases with time, and bridging between the nuclei results in the deposited metal layer being substantially pore free. FIG. 5 is an electron micrograph which illustrates the nucleation spread of copper crystals across the polypyrrole coated epoxy laminate.

The incorporation of various different dopant anions in the polymeric film was investigated by varying the acid and/or salt components present in the monomer solution. Thus, 3.4 mm thick FR4 boards were metallised in accordance with method A. The boards were conditioned and oxidised for 3 and 15 minutes respectively, and then the acidic monomer solution was applied in which the pyrrole and acid concentrations were 0.1 M and 0.13 M respectively. A current density of 1 Adm$^{-2}$ was used during the electrolytic deposition of copper until total coverage was obtained, and then the current density was increased to 3 Adm$^{-2}$ for a further hour. The results of the tests are set out in Table 1. In this Table, the degree of conductivity obtained is related to the time it takes for copper to connect at the edges of the test board by nucleation spread.

TABLE 1

| Dopant Acid | Conc. (ml/l) | Conductivity Factor (min) | Adhesion Grade | Coverage (%) |
|---|---|---|---|---|
| Toluene-4-sulphonic | 25.0 (g/l) | 5 | 85 | 100 |
| Methane sulfonic | 12.8 | 21 | 48 | 100 |
| Hydrochloric | 11.0 | 15 | 63 | 100 |
| Sulphuric | 6.9 | 18 | 67 | 100 |

It was observed that the greater the conductivity, the lower the time required for total coverage. The adhesion grade also appeared to be related to the dopant anion, though the reason for this is unclear.

The adhesion grades obtained in this test were acceptable (>60), but not perfect. The best results were obtained using toluene-4-sulphonic acid as the acidic component. It was found that the problems with adhesion were due to resin recession and not hole-wall pull-away which was never observed.

Scanning electron microscopy examination of the copper/epoxy interface down-hole showed three distinct regions irrespective of the acid present in the monomer solution. The regions correspond to a copper layer, a black stained cracked epoxy layer and an untreated epoxy layer. The thickness of the cracked epoxy layer was found to be related to the length of time the board was immersed in the conditioner and oxidiser.

In a further set of experiments, it was found that optimised adhesion of the copper layer to the hole-wall surface was obtained when the conditioner and oxidising times were adjusted to about 3 and 15 minutes respectively. These conditions gave an adhesion grade of 80 or greater, with the thickness of the black stained cracked epoxy region being about 6 microns. Reduction of the oxidation immersion time to 5 minutes or less or removal of the conditioner step results in the surface topography being smooth and void of islands and has the effect of reducing the hole-wall adhesion grade to below 65. On the other hand, the use of conditioning and oxidising times substantially greater than 5 and 15 minutes respectively caused the trough depth between the islands to be up to 13 microns resulting in relatively poor hole-wall adhesion of the copper with the islands being removed on polishing giving the appearance of severe resin recession.

The conductivity of the polymeric film is increased by increasing the organic monomer and/or the acid concentration. Optimum adhesion is obtained using a pyrrole concentration of about 15 ml/l, a toluene-4-sulphonic acid concentration of about 10 g/l, and a sodium toluene-4-sulphonate concention of about 10 g/l.

Long term plating tests were carried out to investigate the stability of the pyrrole solution using the following conditions:

| Conditioner | 3 minutes, 65° C. |
|---|---|
| Oxidiser | 15 minutes, 50° C. |
| Monomer solution | 1 minute, 22–25° C. |
| Air Dry | 1 minute, room temperature |

The monomer solution comprised 6 ml/l of pyrrole, 25 g/l of toluene sulphonic acid and 1 ml/l 50% methanol of nonyl phenyl ethoxylate. Plating tests in the pyrrole solutions were carried out in a filtered, replenished solution and an unfiltered, unreplenished solution as a control. The pyrrole and toluene sulphonic acid concentrations were monitored by HPLC using a $C_{18}$ reverse phase column, an acetonitrile/water eluent and a UV detector at 220 nm. A current density of 1 Adm$^{-2}$ was used during initial electrolytic copper deposition for 15 minutes, which was then increased to 3 Adm$^{-2}$ for a further hour. The results are summarized in Tables 2 and 3.

TABLE 2

Summary of Long Term Coverage Tests Using Optimised Filtered Plating Solution.

| Time (days) | Surface (dm$^2$) | Plating (min) | Adhesion grade | HPLC Pyrrole (ml/l) | HPLC TSA (g/l) | Coverage |
|---|---|---|---|---|---|---|
| 0 | 0 | — | — | 6 | 25 | — |
| 0 | 0.5 | 5 | 86.6 | — | — | 100 |
| 0 | 1.0 | 8 | — | — | — | — |
| 1 | 1.0 | — | — | 4.9 | 25 | — |
| 1 | 1.5 | 8 | 75.0 | 5.8 | 26 | 100 |
| 2 | 1.5 | — | — | 5.2 | 24 | — |
| 2 | 2.0 | 10 | 74.2 | 5.8 | 25 | 100 |
| 2 | 2.5 | 9 | 80.4 | 5.6 | 24 | 100 |
| 5 | 3.0 | 25 (oxidiser changed) | 84.4 | 4.8 | 24 | 100 |
| 5 | 3.5 | 12.5 | 91.1 | 5.7 | 23.4 | 100 |
| 5 | 3.5 | — | — | 5.8 | 23.6 | — |
| 6 | 4.0 | 12.0 | 92.5 | 6.0 | 25 | 100 |
| 6 | 4.5 | 14.0 (method B) | 91.4 | 6.0 | 25 | 100 |
| 7 | 5.0 | 12.5 | 85 | 6.0 | 25 | 100 |
| 7 | 5.5 | 12.5 (method B) | 100 | 5.9 | 25 | 100 |
| 9 | 6.0 | — | — | 5.3 | 25 | — |
| 9 | 6.5 | 13.5 (method B) | 80.0 | 6.0 | 25 | 100 |
| 9 | 7.0 | 13.5 | 90.0 | 5.9 | 25 | 100 |
| 12 | 7.0 | — | — | 4.7 | 25 | — |
| 12 | 7.5 | 14.0 | 80.0 | 6.0 | 25 | 100 |
| 12 | 7.5 | — | — | 5.9 | 25 | — |
| 12 | 8.0 | 27 (HARB) | 60 | 5.9 | 25 | 90 |
| 14 | 8.5 | 15 (method B) | 68.8 | 6.5 | 22 | 100 |
| 19 | 9.0 | 18 (method B) | 67.5 | 6.0 | 25 | 100 |

TABLE 2-continued

Summary of Long Term Coverage Tests Using Optimised Filtered Plating Solution.

| Time (days) | Surface (dm$^2$) | Plating (min) | Adhesion grade | HPLC Pyrrole (ml/l) | TSA (g/l) | Coverage |
|---|---|---|---|---|---|---|
| 0 | 0 | — | — | 6 | 25 | — |
| 0 | 0.5 | 5 | 86.6 | — | — | 100 |
| 0 | 1.0 | 8 | — | — | — | — |
| 1 | 1.0 | — | — | 4.9 | 25 | — |
| 1 | 1.5 | 8 | 75.0 | 5.8 | 26 | 100 |
| 2 | 1.5 | — | — | 5.2 | 24 | — |
| 2 | 2.0 | 10 | 74.2 | 5.8 | 25 | 100 |
| 2 | 2.5 | 9 | 80.4 | 5.6 | 24 | 100 |
| 5 | 3.0 | 25 (oxidiser changed) | 84.4 | 4.8 | 24 | 100 |
| 5 | 3.5 | 12.5 | 91.1 | 5.7 | 23.4 | 100 |
| 5 | 3.5 | — | — | 5.8 | 23.6 | — |
| 6 | 4.0 | 12.0 | 92.5 | 6.0 | 25 | 100 |
| 6 | 4.5 | 14.0 (method B) | 91.4 | 6.0 | 25 | 100 |
| 7 | 5.0 | 12.5 | 85 | 6.0 | 25 | 100 |
| 7 | 5.5 | 12.5 (method B) | 100 | 5.9 | 25 | 100 |
| 9 | 6.0 | — | — | 5.3 | 25 | — |
| 9 | 6.5 | 13.5 (method B) | 80.0 | 6.0 | 25 | 100 |
| 9 | 7.0 | 13.5 | 90.0 | 5.9 | 25 | 100 |
| 12 | 7.0 | — | — | 4.7 | 25 | — |
| 12 | 7.5 | 14.0 | 80.0 | 6.0 | 25 | 100 |
| 12 | 7.5 | — | — | 5.9 | 25 | — |
| 12 | 8.0 | 27 (HARB) | 60 | 5.9 | 25 | 90 |
| 14 | 8.5 | 15 (method B) | 68.8 | 6.5 | 22 | 100 |
| 19 | 9.0 | 18 (method B) | 67.5 | 6.0 | 25 | 100 |

TABLE 3

Summary of Long Term Coverage Tests Using Optimised Unfiltered Plating Solution

| Time (days) | Surface (dm$^2$) | Plating (min) | Adhesion grade | HPLC Pyrrole (ml/l) | TSA (g/l) | Coverage |
|---|---|---|---|---|---|---|
| 0 | 0 | — | — | 6.0 | 25 | — |
| 0 | 0.5 | 5 | 72.0 | 5.9 | 25 | 100 |
| 0 | 1.0 | — | — | — | — | — |
| 1 | 1.0 | — | — | 5.0 | 24 | — |
| 1 | 1.5 | 8 | 56 | 5.0 | 24 | 100 |
| 2 | 1.5 | — | — | 4.5 | 24 | — |
| 2 | 2.0 | 10 | 48.5 | — | — | 100 |
| 2 | 2.5 | 6 (multi-layer) | — | 4.5 | 24 | 90 |
| 5 | 3.0 | 18 | 45.1 | 3.7 | 24.3 | 100 |
| 5 | 3.5 | 18 (oxidiser changed) | 83.3 | — | — | 100 |
| 5 | 3.5 | — | — | 4.0 | 23.4 | — |
| 6 | 4.0 | 18 | 58 | — | — | — |
| 6 | 4.5 | 21 (method B) | 75 | — | — | 100 |
| 7 | 5.0 | 20 | 51.1 | — | — | 100 |
| 7 | 5.5 | 25 (method B) | 80 | — | — | 100 |
| 9 | 5.5 | — | — | 2.6 | 24 | — |
| 9 | 6.0 | 25 | 76.6 | — | — | 100 |
| 9 | 6.5 | 28 (method B) | 92.5 | — | — | 100 |
| 9 | 6.5 | — | — | 2.4 | 23.5 | — |
| 10 | 7.0 | — | — | 2.0 | 23 | — |
| 10 | 7.5 | 13 | 85.7 | 5.7 | 25 | 100 |

In the above Tables 2 and 3, a method closely modelled on method A is used unless otherwise indicated. Where indicated, the oxidiser was changed due to contamination. The conductivity continually declined in the unreplenished solution and appeared to be directly related to the concentration of pyrrole in the solution and not to the toluene sulphonic acid whose concentration remained substantially unchanged over the duration of the experiments. Although coverage was generally 100% in both replenished and unreplenished solutions, the surface morphology became increasingly nodular as the concentration of pyrrole declined and with increasing coverage times.

The adhesion grade is found to be dependent on the age of the conditioner and oxidiser, as well as the concentration of pyrrole in the monomer solution. FIGS. 6 and 7 illustrate how the age of the permanganate oxidiser solution alters the topography of the epoxy laminate. In particular, the population islets become increasingly dense as the permanganate solution ages. Although this may assist in the adhesion properties of the deposit due to an increased binding area being available, contamination of the solution adversely effects the adhesion grade.

The results indicate that method B produces a superior adhesion grade to method A. This may be because method B causes less resin recession than method A.

Method B was used in the metallisation of double sided and multi-layer 4:1 aspect ratio boards using the aged replenished solution. Total coverage with adhesion grades of 100 were obtained using the following pre-treatment conditions.

| | |
|---|---|
| Conditioner | 65° C., 4 minutes |
| Oxidiser | 80° C., 10 minutes |
| Neutraliser | 55° C., 5 minutes |
| Oxidiser | 80° C., 5 minutes |
| Monomer solution | 25° C., 3 minutes |
| Air Dry | room temperature, 1 minute |

The same method was used in the plating of high aspect ratio 8:1 boards, but these suffered from poor coverage of the glass fibers due to etch depth and long coverage times of up to 30 minutes. This poor hole-wall coverage is illustrated in FIG. 8. This problem can be overcome by increasing the pyrrole concentration and/or by the addition of a small amount of gelatin, to the pyrrole solution. Around 2.1 g/l of gelatin is quite effective, although it does have some detrimental effects. FIG. 9 is an electron micrograph showing the hole-wall coverage which results when these two changes are made.

Comparable experiments were carried out using aniline and thiophene in place of pyrrole. Although useful, these monomers are more difficult to apply successfully on an industrial scale. For instance, thiophene has a relatively high toxicity, and both polyaniline and polythiophene films are not so conductive as the polypyrrole film and so the resulting board can only be metallised with difficulty.

We claim:

1. A process for metallising a through-hole board comprising the steps of:
   pre-treating the board with an oxidising agent to micro-roughen its surface,
   forming an electro-conductive polymer film on the micro-roughened surface by oxidatively polymerizing in situ an acidic solution of an organic monomer with an oxidising agent previously adsorbed on the board, the film incorporating dopant anions acquired from the monomer solution, and
   electroplating a metal on the electro-conductive polymer film.

2. A process according to claim 1 wherein the board is treated with a conditioner to soften the surface prior to the oxidising step.

3. A process according to claim 2 wherein the conditioner is applied to the laminate for about 3-5 minutes and/or the oxidising agent is applied to the laminate for about 5 minutes.

4. A process according to claim 1 further comprising the steps of neutralising the board after the pre-treatment step and re-oxidising the neutralised board with an oxidising agent capable of being adsorbed by the board's surface.

5. A process according to claim 4 wherein the organic monomer is pyrrole, furane, aniline or thiophene or a derivative thereof.

6. A process according to claim 5 wherein the concentration of pyrrole in the acidic solution is 6-25 ml/l.

7. A process according to claim 1 wherein the acidic solution further comprises gelatin and/or a surfactant and/or an alcohol.

8. A process according to claim 7 wherein the acidic solution comprises up to 15% by volume of methanol or propanol.

9. A process according to claim 1 wherein the acidic solution comprises toluene sulphonic acid, methane sulphonic acid, hydrochloric acid or sulphuric acid.

10. A process according to claim 9 wherein the concentration of toluene sulphonic acid in the acidic solution is 5-25 gl/l.

11. A process according to claim 1 wherein the acidic solution further comprises a salt.

12. A process according to claim 11 wherein the salt is derived from the acidic component of the acidic solution.

13. A process according to claim 1 wherein the pH of the solution is 1.7-2.5.

14. A process according to claim 1 wherein the oxidising agent is the permanganate of an alkali metal.

15. A process according to claim 1 wherein the board is a drilled epoxy laminate.

16. A process according to claim 1 wherein the board is a double sided 4:1 aspect ratio board, a multi-layer 4:1 aspect ratio board or a high 8:1 aspect ratio board.

* * * * *